(12) United States Patent
Wan et al.

(10) Patent No.: US 11,398,414 B2
(45) Date of Patent: Jul. 26, 2022

(54) SLOPED METAL FEATURES FOR COOLING HOTSPOTS IN STACKED-DIE PACKAGES

(71) Applicant: INTEL CORPORATION, Santa Clara, CA (US)

(72) Inventors: Zhimin Wan, Chandler, AZ (US); Chia-Pin Chiu, Tempe, AZ (US); Pooya Tadayon, Portland, OR (US); Joe F. Walczyk, Tigard, OR (US); Chandra Mohan Jha, Tempe, AZ (US); Weihua Tang, Chandler, AZ (US); Shrenik Kothari, Chandler, AZ (US); Shankar Devasenathipathy, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 792 days.

(21) Appl. No.: 16/142,864

(22) Filed: Sep. 26, 2018

(65) Prior Publication Data
US 2020/0098666 A1    Mar. 26, 2020

(51) Int. Cl.
*H01L 23/433*    (2006.01)
*H01L 25/065*    (2006.01)
(Continued)

(52) U.S. Cl.
CPC ........ *H01L 23/433* (2013.01); *H01L 23/3121* (2013.01); *H01L 23/367* (2013.01); *H01L 25/0657* (2013.01)

(58) Field of Classification Search
CPC .. H01L 23/433; H01L 23/367; H01L 25/0657
See application file for complete search history.

(56) References Cited

U.S. PATENT DOCUMENTS

| | | | | |
|---|---|---|---|---|
| 7,042,084 B2* | 5/2006 | Takeuchi | ............. | H01L 23/051 257/706 |
| 2007/0290322 A1* | 12/2007 | Zhao | ................ | H01L 23/49816 257/E23.102 |
| 2014/0225248 A1* | 8/2014 | Henderson | ......... | H01L 23/5383 438/122 |

OTHER PUBLICATIONS

"Thermal copper pillar bump," Wikipedia, downloaded from the Internet at URL: https://en.wikipedia.org/wiki/Thermal_copper_pillar_bump, on Sep. 15, 2018. 7 pages.
(Continued)

*Primary Examiner* — Dale E Page
*Assistant Examiner* — Wilner Jean Baptiste
(74) *Attorney, Agent, or Firm* — Schwabe, Williamson & Wyatt, P.C.

(57) ABSTRACT

Heat dissipation techniques include using metal features having one or more slanted or otherwise laterally-extending aspects. The metal features include, for example, tilted metal pillars, or metal bodies or fillets having an angled or sloping sidewall, or other metal features that extend both vertically and laterally. Such metal features increase the effective heat transfer area significantly by spreading heat in the in-plane (lateral) direction, in addition to the vertical direction. In some embodiments, slanted trenches are formed in photoresist/mold material deposited over a lower die, using photolithography and a multi-angle lens, or by laser drilling mold material deposited over the lower die. The trenches are then filled with metal. In other embodiments, metal features are printed on the lower die, and then molding material is deposited over the printed features. In any such cases, heat is conducted from a lower die to an upper die and/or an integrated heat spreader.

11 Claims, 8 Drawing Sheets

(51) Int. Cl.
*H01L 23/31* (2006.01)
*H01L 23/367* (2006.01)

(56) References Cited

OTHER PUBLICATIONS

"Copper Pillar Electroplating Tutorial," Dow Electronic Materials, downloaded from the Internet at URL: http://blog.dowelectronicmaterials.com/en/posts/2016/12/copper-pillar-electroplating-tutorialon, on Sep. 15, 2018. 7 pages.

Hillman, Craig, "Overview of Copper Pillar Technology," downloaded from the Internet at URL: https://www.dfrsolutions.com/resources/overview-of-copper-pillar-technology, on Sep. 15, 2018. 42 pages.

* cited by examiner

677: Trenches 675 filled with metal, any excess metal removed, sacrificial material 673 removed, release die 107 from platform 671

SLOPED METAL FEATURES FOR COOLING HOTSPOTS IN STACKED-DIE PACKAGES

BACKGROUND

Integrated circuitry continues to scale to smaller feature dimensions and higher packaging densities. With such scaling, the density of power consumption of a given microelectronic device within a given package tends to increase, which, in turn, tends to increase the average junction temperature of transistors of that device. If the temperature of the microelectronic device becomes too high, the integrated circuits making up that device may be damaged or otherwise suffer performance issues (e.g., sub-optimal performance such as low gain or slow switching speeds, or catastrophic failure where one or more portions of the integrated circuitry is destroyed). This issue is exacerbated when multiple microelectronic devices are incorporated in close proximity to one another in a stacked-die configuration. Thus, thermal transfer solutions, such as integrated heat spreaders, must be utilized to remove heat from such microelectronic devices. There are a number of non-trivial and unresolved issues associated with thermal management.

BRIEF DESCRIPTION OF THE DRAWINGS

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Heat dissipation techniques are disclosed that include using thermally conductive metal features having one or more slanted or otherwise laterally-extending aspects. The metal features include, for example, tilted metal pillars, or metal fillets having an angled or sloping sidewall, or other metal features that extend laterally while also extending vertically. Such metal features increase the effective heat transfer area significantly by spreading heat in the in-plane (lateral) direction, in addition to the vertical direction. So, for instance, in an integrated circuit package including a stacked-die configuration, the metal features allow heat to be conducted from a lower die to an upper die and/or an integrated heat spreader, which in turn lowers junction temperatures of the integrated circuitry making up the die. The metal features can be made using a number of techniques. For instance, in some example embodiments, slanted trenches are formed in photoresist or mold material deposited over the lower die, using photolithography and a multi-angle lens, or by laser drilling sacrificial or mold material deposited over the lower die. The trenches are then filled with metal, such as by electroplating. In other embodiments, metal features are printed on the lower die, such as by inkjet printing or 3D printing technology, and then molding material is deposited over the printed features. Numerous embodiments and variations will be apparent in light of this disclosure.

General Overview

As previously explained, there a number of non-trivial and unresolved issues associated with thermal management solutions for integrated circuitry, particularly with respect to integrated circuit packages that include a stacked-die configuration. For instance, to add structural integrity to the stacked-die arrangement, a mold compound is utilized that infiltrates open areas between and to the sides of the stacked-die package. However, as will be appreciated in light of this disclosure, it is difficult in such stacked-die packages for the bottom die to dissipate heat in areas covered by the mold compound. This is because the mold compound is not very thermally conductive (e.g., about 0.3 to 0.8 W/m-K, would be typical). To this end, high power density under one or more mold regions can cause hotspots due to the low thermal conductivity of the mold compound. Such hotspots in turn limit the performance of the integrated circuitry. Possible solutions to this problem include: (1) increasing the thermal conductivity of the mold compound; (2) reducing the top die thickness and thus the mold thickness; and (3) provisioning of through-mold metal vias. However, with respect to solution (1), note that mold material having high thermal conductivity is relatively expensive. Moreover, even the higher thermal conductivity is still relatively low (~2.4 W/m-K). With respect to solution (2), thin die can be difficult to manufacture and are easier to crack, and are thus prone to yield issues. With respect to the solution (3), through-mold metal vias can be used to create a vertical heat transfer path from bottom die to the integrated heat spreader (IHS). However, and as will be appreciated in light of this disclosure, there still exists relatively high heat spreading resistance due to the hotspots. In particular, heat can dissipate vertically up the metal via, but not laterally, which limits the effectiveness of the through-mold metal via.

Thus, heat dissipation techniques are disclosed herein that include using metal features having one or more laterally-extending aspects. The metal features may include, for example, slanted metal pillars, or metal fillets or bodies having an angled or slanted sidewall, or other metal features that extend laterally while also extending vertically (having both rise-and-run aspects, so as to have a sloping aspect). As will be appreciated in light of this disclosure, such slanted or angled or otherwise laterally-extending metal features increase the effective heat transfer area significantly by spreading heat in the in-plane (lateral) direction, in addition to the vertical direction. The metal features can be fabricated in a number of ways and using a number of materials.

For instance, in some embodiments, tilted copper pillars are fabricated by electroplating copper into slanted trenches formed in a sacrificial structure. The sacrificial structure can be patterned or otherwise formed on the bottom die, so the pillars are in contact with the bottom die. In some cases, photolithography and a multi-angle lens are used to pattern multiple slanted (and possibly one or more straight/vertical) trenches in a layer of photoresist deposited over the bottom die. The resulting slanted trenches can then be filled with copper by way of electroplating, according to some such embodiments, although other metal deposition techniques can be used. In still other embodiments, a laser drill process is used to form the various angled trenches in a sacrificial material, which can subsequently be filled with copper. In some cases, the sacrificial material or structure may be made of the mold compound, and therefore remain (at least in part) in the stacked-die package.

In still other embodiments, the slanted or laterally-extending features are printed on the bottom die, prior to deposition of the mold material. For instance, a metal nanoparticle fillet or body can be created on top of the bottom die by inkjet printing or 3D printing technology before the molding process. As used herein, the term body is intended to include fillet. The fillet can be sintered to further improve its thermal conductivity. Molding material can be deposited over the fillet. In addition to having a bottom surface that is on the bottom die, the metal fillet can have a sidewall that abuts the sidewall of a neighboring top die. The cross-sectional profile of such a fillet looks somewhat like a right triangle, wherein the hypotenuse side of the triangle-shaped metal feature assists in lateral heat dissipation. Note that the hypotenuse-like sidewall need not be a perfectly straight diagonal sidewall but can rise and fall or otherwise be irregular in profile as it generally extends from a bottom surface of the molding material to an upper or sidewall surface of the molding material, so as to provide lateral and vertical heat dissipation. To this end, inkjet and 3D printing technology can be used to provide any number of fillet shapes and profiles.

In an embodiment, the thermal conductivity of slanted copper pillars can be up to about 380 W/m-K. So, an effective heat transfer path is created from the bottom die to the integrated heat spreader. Also, the angled, tilted, slanted or otherwise laterally-extending copper metal features can help spread heat in the lateral, in-plane direction in addition to the vertical direction, so as to further reduce the bottom die temperature. Likewise, just as with a tilted copper pillar, a copper fillet has a thermal conductivity up to about 344 W/m-K, after nanoparticle sintering. So, an effective heat transfer path is created from the bottom die to a given top die, and from the top die to the integrated heat spreader.

While copper is used in some examples herein due to its relatively high thermal conductivity, note that other materials can also be used. For instance, according to other embodiments, the metal features can be made of, for example, aluminum, beryllium, gold, silver, or other metals having a relatively high thermal conductivity, such as metals having a thermal conductivity in excess of 200 Watts per meter-Kelvin (W/m-K), or in excess of 300 W/m-K, or higher. In a more general sense, any metal can be used as long as it has a thermal conductivity that is suitable for a given application.

As will be further appreciated, the hotspot locations may vary from one configuration to the next. In one example scenario where the edges of the bottom die extend laterally beyond the top die on at least one side, or opposing sides, or all sides, such that those one or more edges and nearby top surface portion of the bottom die are covered by mold material (rather than an upper die). In some such embodiments, tilted copper or other metal pillars can be located within those portions of mold material, to mitigate the edge-based hotspot. Note that not all the metal pillars within a given portion of mold material need to be tilted (some may be straight/vertical). In other such embodiments, printed copper fillets or other metal features have a slanted sidewall or other laterally-extending sidewall can be located under those portions of mold material, to mitigate the edge-based hotspot. In a more general sense, angled or laterally-extending metal features can be used anywhere on a lower die of a stacked die configuration to facilitate heat transfer to an upper die and/or the integrated heat spreader. Numerous configurations will be apparent in light of this disclosure.

Note that the phrase "bottom die" herein is not intended to be limited to the bottommost die in a given stacked-die arrangement; nor is "top die" intended to be limited to the topmost die in a given stacked-die package. Rather, top and bottom used in this way merely indicate that the top die is higher in the package than the bottom die, and that the bottom die is lower in the package than the top die.

A first simulation was done with uniform power for both top and bottom die to compare vertical through-mold copper vias and tilted copper pillars. For a hotspot area 1 $mm^2$, mold material thickness of 0.5 mm (vertical thickness), the effective heat transfer area of vertical through-mold copper vias was about 1 $mm^2$. For tilted copper pillars with a tilt angle up to 45 degrees, the effective heat transfer area was about 2.9 $mm^2$. That is about 3× more heat transfer than provided by vertical through-mold copper vias. This translated to a reduction in maximum junction temperature of about 10° C. for a 5-Watt hotspot. Greater tilt can provide further reduction. A similar simulation was done with uniform power for both top and bottom die to compare vertical through-mold copper vias and copper, sintered nanoparticle fillets. The maximum junction temperature was reduced in the range of about 5° C. to 10° C. under uniform heating conduction. For non-uniform power with high power density on the edge, the benefit can be even higher.

As will be appreciated, a vertical metal feature may have some degree of unintended tilt (e.g., less than +/−1 degree), which is to be distinguished from intentional tilt as variously described herein, which for example could be in the range of 5 to 60 degrees (tilt is with respect to vertical axis). In some embodiments, metal pillars are provided with a tilt angle off vertical in the range of 15 to 60 degrees, or 20 to 50 degrees, or 20 to 40 degrees, or 20 to 30 degrees, or 25 to 60 degrees, or 25 to 50 degrees, 25 to 35 degrees, or 30 to 60 degrees, or 30 to 50 degrees, or 30 to 40 degrees, or any other tilt angle or slope that can be achieved to provide both vertical and lateral heat dissipation.

Architecture

Figure 1A:
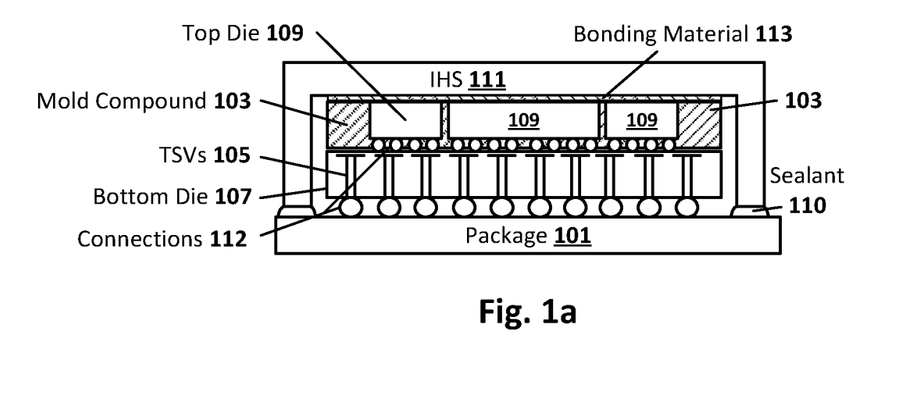
FIG. 1a illustrates a cross-section view of an integrated circuit package including a stacked-die configuration.
Figure 1B:
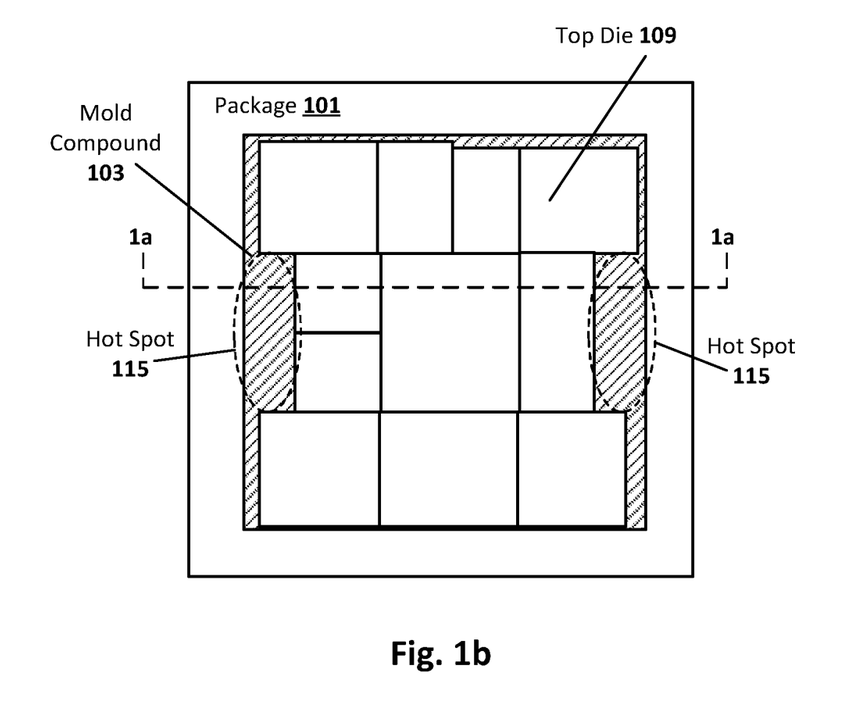
FIG. 1b is a top down view of the package with the integrated heat spreader removed so as to show potential hot spot regions that occur in areas over the bottom die and covered by mold material.

FIG. 1a illustrates a cross-section view of an integrated circuit package including a stacked-die configuration, and FIG. 1b is a top down view of the package with the integrated heat spreader removed so as to show potential hot spot regions that occur in areas over the bottom die and covered by mold material. Note that the location of the cross-section shown in FIG. 1a is indicated with dashed line 1a-1a in FIG. 1b.

As can be seen, the stacked-die configuration includes bottom die 107 and a number of top die 109 arranged above the bottom die 107. As can further be seen in this example embodiment, mounting connections 112 are used to operatively couple the bottom die 107 to package 101, as well as to couple the top die 109 to the bottom die 107. Example mounting technologies that can be used for connections 112 include, for instance, flip-chip bumps, or ball grid arrays (BGAs). Other configurations may use any number of other suitable connecting mechanisms (e.g., pin grid array, dual-inline surface mount, etc), as will be appreciated. An integrated heat spreader (IHS) 111 is coupled with package 101 using a sealant 110 to enclose the stacked-die configuration. In addition, IHS 111 is bonded to the top die 109 via a thermally conductive bonding material 113. A mold compound 103 is provided in major (and possibly minor) void areas, such as in locations near edges of the bottom die 107 where there is no top die 109 directly above.

Note that the term "above" as used herein does not necessarily mean directly upward or over unless specifically stated; rather, above is intended to mean at a higher level or layer than. So, for instance, a top die can be above a bottom die, but not necessarily directly above the bottom die. In cases where a top die is directly above a bottom die, an imaginary vertical plane can pass through both die. In other cases where a top die is above a bottom die but not directly above that bottom die, then no imaginary vertical plane can pass through both die. In any such arrangements, note that there may be one or more intervening layers between a top and bottom die (or other top and bottom features), even if the top die is said to be directly above the bottom die. Further note that the term "over" as used herein means directly upward or directly above. So, for instance, in cases where a mold material is over a bottom die, an imaginary vertical plane can pass through both the mold material and the bottom die. In such cases, further note that there may be one or more intervening layers between the mold material and the bottom die (or other top and bottom features). As will be further appreciated, the term "directly on" may be used to indicate that there are no intervening layers between the mold material and the bottom die (or other top and bottom features). Note that the term "adjacent" as used herein does not necessarily mean directly on unless specifically stated; rather, adjacent is intended to mean next to. So, for instance, mold material can be adjacent to a top die, but not necessarily directly touching the top die (e.g., there may be intervening layer(s), but the mold material is still sufficiently next to the die, such as within 3 nm of the die, or 2 nm of the die, or 1 nm of the die, etc). As will be further appreciated, a larger scale of features (micrometer scale versus nanoscale) may have a larger distance qualify as adjacent.

As can be further seen in FIGS. 1a and 1b, bottom die 107 of this example includes a number of through-silicon vias (TSVs) 105, and there are a number of top die 109 (eleven of them in this example case) arranged in an arbitrary layout. However, and as will be appreciated, the actual configurations of bottom die 107 and top die 109 aren't particularly relevant to the present disclosure. Nor is the number of top or bottom die, or how those die are arranged or laid out. Rather, the bottom die 107 and top die 109 can be generalized to any two or more die that, when operatively coupled together within package 101, can benefit from a thermal management scheme to dissipate heat they generate. Hence, IHS 111 can be used to implement such a scheme.

In operation, heat generated by the bottom die 107 is passed upward to die 109 by way of connections 112 (e.g., flip-chip bumps) when the transistor circuit of bottom die 107 is located on the top side of bottom die 107. In other cases, the heat generated by bottom die 107 is passed upward to top ide 109 by way of connections 112 (e.g., flip-chip bumps) and TSV 105 when the transistor circuit of bottom die 107 is located on the bottom side of bottom die 107. The heat is then passed to IHS 111 by way of bonding material 113 and is spread across the area of the IHS 111 and dissipated. However, and as can be seen in FIG. 1b, hot spot regions 115 exist where there is bulk mold compound 103, such as at the midpoints of the right and left edges of the bottom die 107 where there is no top die 109 directly above. As previously explained, mold compound 103 tends to have a relatively low thermal conductivity and therefore is not particularly well-suited to transferring heat of the bottom die 107 to the IHS 111.

Figure 2A:
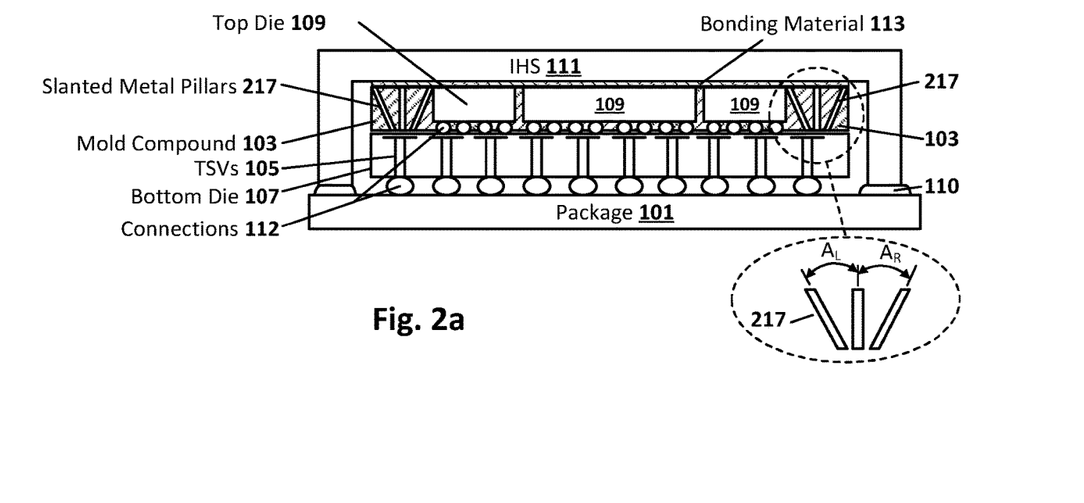
FIG. 2a illustrates a cross-section view of an integrated circuit package including a stacked-die configuration and slanted metal pillars in the mold material to conduct heat from the bottom die to the integrated heat spreader, according to an embodiment of the present disclosure.
Figure 2B:
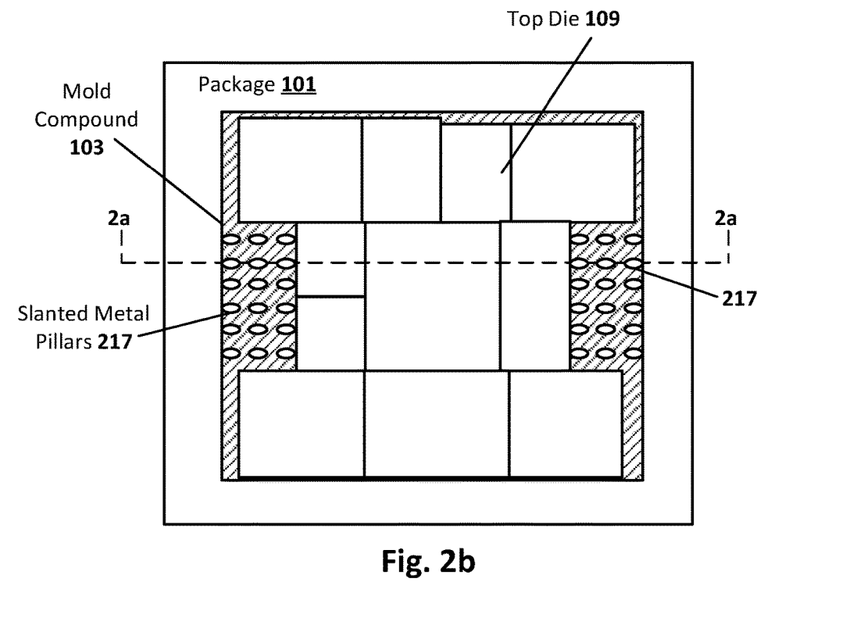
FIG. 2b is a top down view of the stacked-die package shown in FIG. 2a, with the integrated heat spreader removed so as to show the slanted metal pillars embedded in the mold material, according to an embodiment of the present disclosure.

Thus, FIGS. 2a and 2b illustrate cross-section and top views, respectively, of an integrated circuit package similar to that shown in FIGS. 1a and 1b, but that further includes metal pillars 217 in the mold material 103 associated with hot spot regions, so as to better conduct heat from the bottom die 107 to the IHS 111, according to an embodiment of the present disclosure. Note that the location of the cross-section shown in FIG. 2a is indicated with dashed line 2a-2a in FIG. 2b. The previous relevant discussion regarding common features (101 through 115) with respect to FIGS. 1a and 1b is equally applicable here, with the noted modification to mold material 103 in one or more hot spot regions to include one or more metal pillars 217.

As can be best seen in FIG. 2a, note that some of the metal pillars 217 are slanted rather than vertical. In more detail, as best shown in the top down view of FIG. 2b, there are two fields of metal pillars 217 located in respective hot spot regions, one being to the left side of the top die 109 and the other being to the right side of the top die 109. Each field is arranged in a three-by-six array in the mold material 103. As can be further seen in the cross-section shown in FIG. 2a, the outer metal pillars 217 of the array are slanted outward, and the middle metal pillars 217 of the array are generally vertical. The angle of the slanted pillars can be measured, for instance, with respect to the vertical plane, such that the left-tilting pillars have a tilt angle of $A_L$, and the right-tilting pillars have a tilt angle of $A_R$. Although the tilt angle can vary from one embodiment to the next, in one example case $A_L$ and $A_R$ are in the range of about 5 to 65 degrees (e.g., such as 5 to 60 degrees, or 25 to 45 degrees, or 30 to 60 degrees, or 30 to 50 degrees, etc). Note that $A_L$ and $A_R$ (or other tilt angles) of the pillars deployed in a given package need not be the same. In other embodiments, there may be a different number and/or arrangement of metal pillars 217, with one or more pillars having a respective tilt angle, as will be appreciated. For example, there may be a single row of slanted metal pillars 217 running the central length of the mold material 103 in the hot spot region to be mitigated, or a single slanted metal pillar in the middle of that mold material 103, or a slanted metal pillar in each corner of that mold material 103, to name a few example scenarios. The number of hot spot regions may vary as well, whether there be one such area or two, or three, or four, etc, depending on the given package configuration.

Figure 3A:
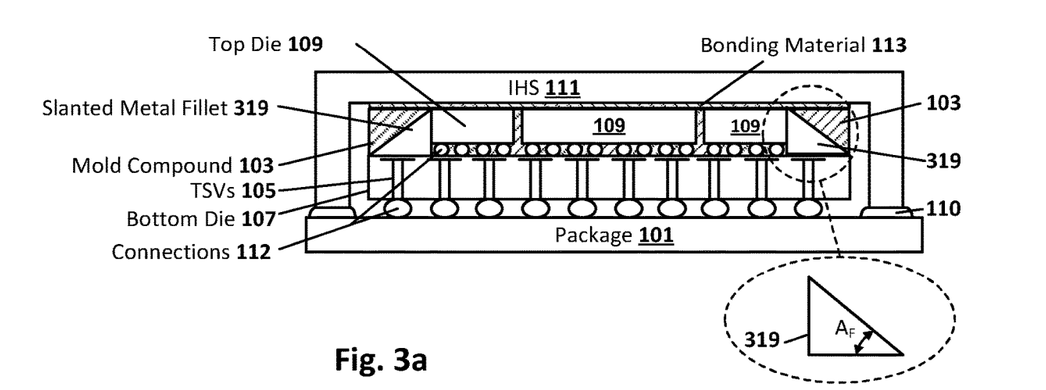
FIG. 3a illustrates a cross-section view of an integrated circuit package including a stacked die configuration and slanted metal fillet or body under the mold material to conduct heat from the bottom die to the integrated heat spreader by way of the top die, according to another embodiment of the present disclosure.
Figure 3B:
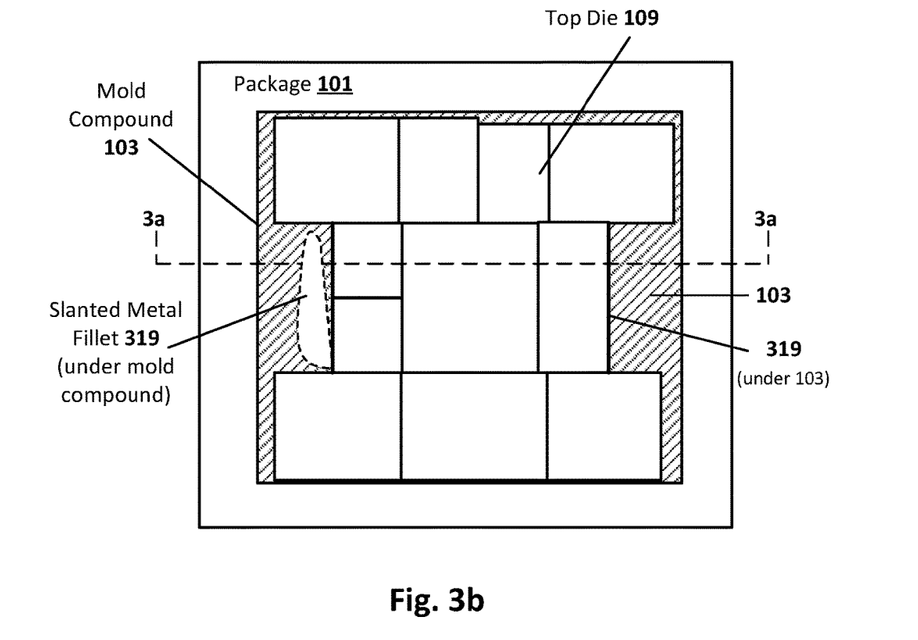
FIG. 3b is a top down view of the package shown in FIG. 3a, with the integrated heat spreader removed and a partial cut-away of mold material so as to show the slanted metal fillet under the mold material, according to an embodiment of the present disclosure.

FIGS. 3a and 3b illustrate cross-section and top views, respectively, of an integrated circuit package similar to that shown in FIGS. 1a and 1b, but that further includes metal fillets 319 under the mold material 103 associated with hot spot regions, so as to better conduct heat from the bottom die 107 to the IHS 111, according to another embodiment of the present disclosure. Note that the location of the cross-section shown in FIG. 3a is indicated with dashed line 3a-3a in FIG. 3b. The previous relevant discussion regarding common features (101 through 113) with respect to FIGS. 1a and 1b is equally applicable here, with the noted modification to mold material 103 in hot spot regions.

As can be best seen in FIG. 3a, note that the metal fillets 319 have a slanted surface that extends both laterally and vertically. In more detail, as best shown in the top down view of FIG. 3b, there are two metal fillets 319 located in respective hot spot regions, one being to the left side of the top die 109 and the other being to the right side of the top die 109. Each metal fillet 319 is effectively under the mold material 103, as shown by the partial cut-away view of FIG. 3b. As can be further seen in FIG. 3a, the metal fillets 319 have a cross-sectional profile that is shaped like a right triangle, with the vertical sidewall adjacent the top die 109, the horizontal sidewall adjacent the bottom die 107, and the slanted (hypotenuse) sidewall running from the bottom die 107 to the top die 109. The angle of the slanted sidewall can be measured, for instance, with respect to the horizontal plane, such that the slanted sidewall of the metal fillets 319 have a slant angle of $A_F$. Although the slant angle can vary from one embodiment to the next, in one example case $A_F$ is in the range of 5 to 60 degrees (e.g., 40 to 50 degrees, or 45 degrees). Note that not all metal fillets 319 deployed in a given package have to have the same slant angle $A_F$. In other embodiments, there may be a different number and/or arrangement of metal fillets 319, with each metal fillet having a respective slant angle, as will be appreciated. For example, there may be one large metal fillet 319 running the length of a given hot spot region to be mitigated, or a there may be a series of smaller metal fillets 319 running the length of that hot spot region, or a combination of metal fillets 319 and slanted metal pillars 217 over the hot spot region, to name a few example scenarios. The number of hot spot regions may vary as well, whether there be one such area or two, or three, or four, etc, depending on the given package configuration.

Methodology

FIGS. 4a through 4f collectively illustrate a method for forming an integrated circuit package including a stacked-die configuration and slanted metal pillars in the mold material to conduct heat from the bottom die to the integrated heat spreader, according to an embodiment of the present disclosure. As can be seen, the integrated circuit package shown in FIGS. 2a and 2b is used to demonstrate the method, but any integrated circuit package of arbitrary configuration can benefit from the methodology. To this end, the methodology is not intended to be limited to any particular integrated circuit package configurations; rather, the methodology can be broadly applied to fabricate metal pillars in hot spot regions of a given integrated circuit package, as will be appreciated in light of this disclosure.

Figure 4A:
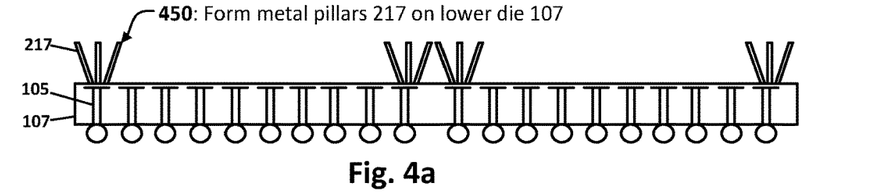
FIGS. 4a through 4f collectively illustrate a method for forming an integrated circuit package including a stacked-die configuration and slanted metal pillars in the mold material to conduct heat from the bottom die to the integrated heat spreader, according to an embodiment of the present disclosure.

As can be seen in FIG. 4a at 450, the method includes forming metal pillars 217 on lower die 107. Example forming processes will be discussed in turn with respect to FIGS. 5a-5d (which collectively show a methodology that uses lithography and electroplating) and FIGS. 6a-6e (which collectively show a methodology that uses laser drilling and electroplating). As previously explained, the metal pillars can be any metal having a desired level of thermal conductivity, such as copper, silver, or gold, to name a few examples. Die 107 can be formed using any number of integrated circuit forming processes, and can have any number of configurations which may or may not have TSVs, as will be appreciated. In some embodiments, die 107 includes metal features, contacts, or pads on which the metal pillars 217 are formed. In a more general sense, the metal pillars 217 can be formed on any feature of die 107 that allows for dissipation of heat from die 107 up through the metal pillars 217, and ultimately to the heat spreader 111. Although flip-chip bumps are shown on the bottom of die 107, those bumps may not be present in other embodiments, or some other mounting technology may be there. Also, note that die 107 at this point in the process may include multiple copies of a given integrated circuit formed, for example, on a wafer, and the individual copies of die 107 can then be liberated from the wafer by way of a singulation process. In other embodiments, die 107 may be singular in nature, and therefore no singulation would be needed. In short, side 107 can be arranged in an arbitrary pattern or layout.

Figure 4B:
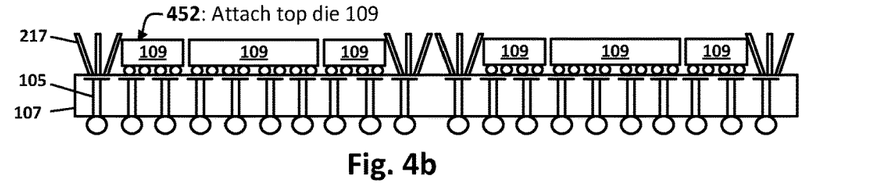

As can be seen in FIG. 4b at 452, the method continues with attaching top die 109 to lower die 107. In this example case, flip-chip technology is used to attach die 109, although any suitable mounting technology can be used, including pin/socket arrangements, BGA, etc. As will be appreciated, the configuration inside bottom die 107 and top die 109 as well as the number and layout of those die are arbitrary and not particularly germane to this disclosure. Rather, it is simply sufficient to know that each die can be the type of die that generates heat during its normal operation and therefore can benefit from thermal management solutions such as those variously provided herein. The stacked-die configuration, for instance, may include locations where a relatively large volume of mold material will deposit on the bottom die 107 and adjacent to a top die 109, thereby creating a potential hot spot region as previously explained. In the example case shown here, the hot spot regions happen to be in locations where there is no top die 109 over bottom die 107 (or locations where there is no top die 109 over a relatively large portion of bottom die 107), which allows a relatively large volume of molding material to deposit there.

Figure 4C:
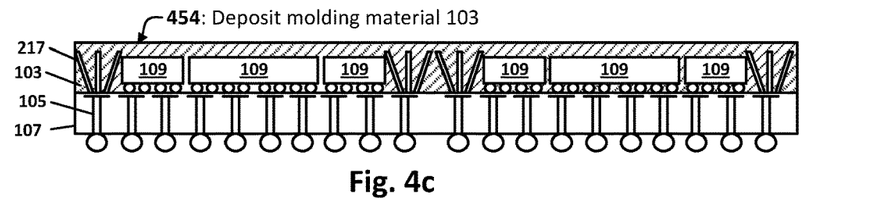
Figure 4D:
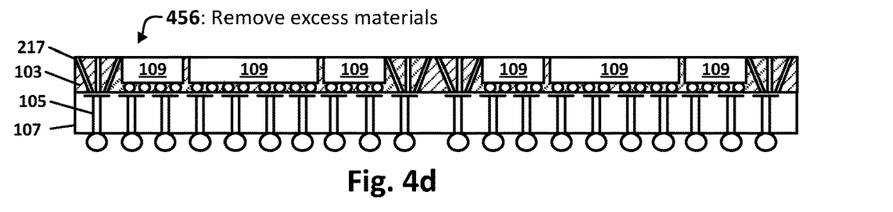

As can be seen in FIGS. 4c and 4d at 454 and 456, respectively, the method continues with depositing mold material 103 over the stacked-die arrangement, and removing any excess materials. Any number of commercially available or proprietary mold materials can be used, which are sometimes called molding compounds or semiconductor mold compounds. Typical mold compounds include, for instance, epoxy resins, hardeners, and catalysts. A molding compound can be selected for a given application based on its properties, such as the material's glass transition temperature, thermal conductivity, coefficient of thermal expansion, flexural modulus, adhesion properties, and/or moisture absorption rate. In any such cases, the excess molding material 103 can be removed by grinding or some other suitable process, so as to expose the top surfaces of die 109.

Figure 4E:
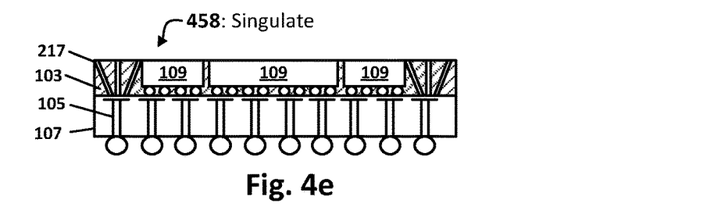
Figure 4F:
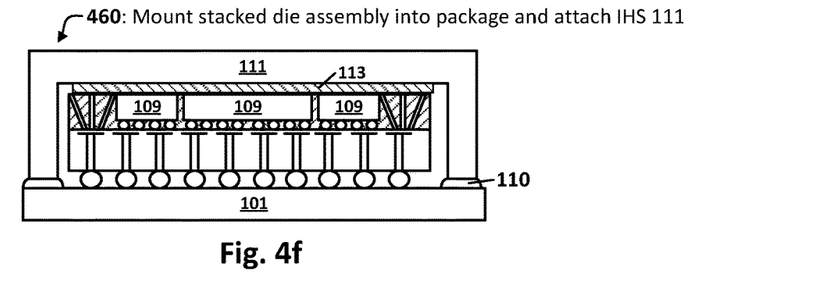

As can be seen in FIG. 4e at 458, the method continues with singulating the wafer or overall structure, so as to release individual stacked-die assemblies. Singulation can be carried out using standard processes and tools, such as a saw or laser or other suitable dicing technologies. As can be seen in FIG. 4f at 460, the method continues with mounting the stacked-die assembly into package 101, and attaching the integrated heat spreader 111 with use of sealant 110. The package 101 and heat spreader 111 can be implemented with standard technologies, such as a ceramic package and a copper IHS 111, although numerous variations will be appreciated. The sealant 110 can be any standard or proprietary IHS sealant (e.g., silicone or epoxy based sealants are typical). Likewise, the bonding material 113 can be any standard or proprietary bonding material having a desired degree of thermal conductivity and adhesive properties, as will be further appreciated.

FIG. 5a through 5d illustrate a method for forming slanted metal pillars 217 over a bottom die 107, according to an embodiment of the present disclosure. As previously explained, this example methodology includes the use of lithography and electroplating, although other metal deposition may be used as well. The method is generally designated at 450a, to show that it is one example methodology that can be used at 450 of FIG. 4 in the forming of metal pillars 217.

Figure 5A:
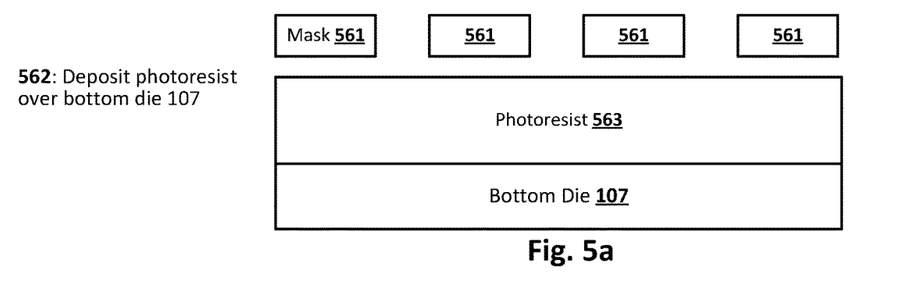
FIG. 5a through 5d illustrate a method for forming slanted metal pillars over a bottom die, according to an embodiment of the present disclosure.
Figure 5B:
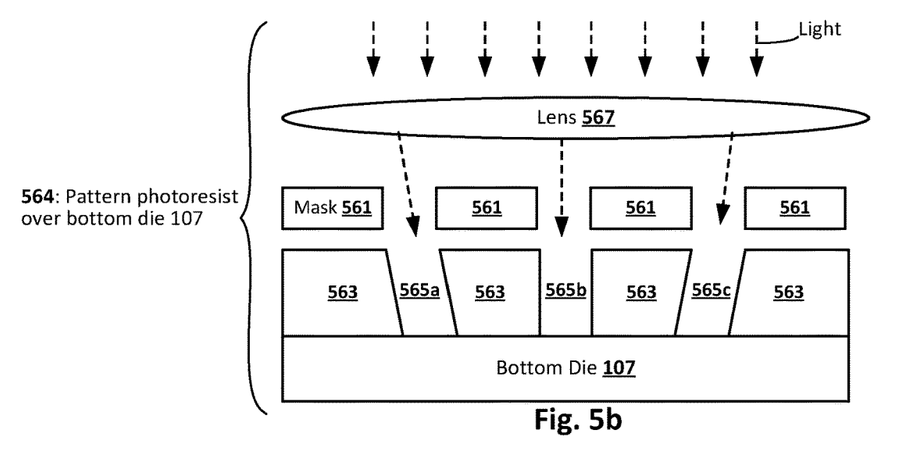

As can be seen in FIGS. 5a and 5b at 562 and 564, respectively, the method includes depositing a layer of photoresist material 563 on the bottom die 107, and then patterning that photoresist material 563. The combination of mask 561 and lens 567 allows angled light (from the exposure light source) to pattern the underlying photoresist 563. In particular, lens 567 causes some light passing therethrough to exit the lens at an angle, as shown. Mask 561 (which may be, for instance, a reticle-based mask, although other masks can be used as will be appreciated) allows light passed by lens 567, including the angled light, to impinge upon the photoresist layer 563, thereby causing multi-angle patterning of the photoresist 563. After removing the exposed photoresist that results from such multi-angle patterning, a number of trenches 565 are formed. As will be appreciated, trench 565a can be used to form a left-tilting pillar that has a tilt angle of $A_L$, trench 565b can be used to form a substantially vertical pillar, and trench 565c can be used to form a right-tilting pillar having a tilt angle of $A_R$ After. The lens 567 can be customized to provide any number of desired multi-angle light patterns, as will be further appreciated. Note that the lens 567 in this example case allow all the trenches 565 to be patterned at the same time. In another embodiment, a more simple lens can be used to pattern the trenches one at a time (or two at a time, or three at a time, etc, depending on the lens configuration). Photoresist 563 can be any number of suitable photoresist materials (SU-8 and PMMA are two examples) that can achieve the desired thickness (so as to provide the desired depth of trenches 565).

Figure 5C:
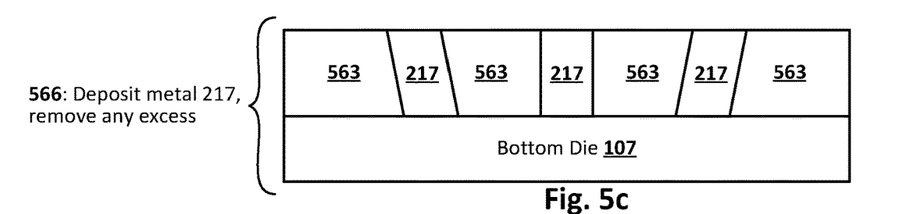

As can be seen in FIG. 5c at 566, the method continues with depositing metal into the trenches 565 and removing any excess. In some embodiments, this includes electroplating copper into the trenches 565, although other embodiments may use other metals (e.g., silver, gold, etc) and/or other deposition techniques (e.g., spraying, spin coating, and printing). Grinding or chemical mechanical polishing (CMP) can be used to remove any excess metal, and to adjust the height of the metal pillars.

Figure 5D:
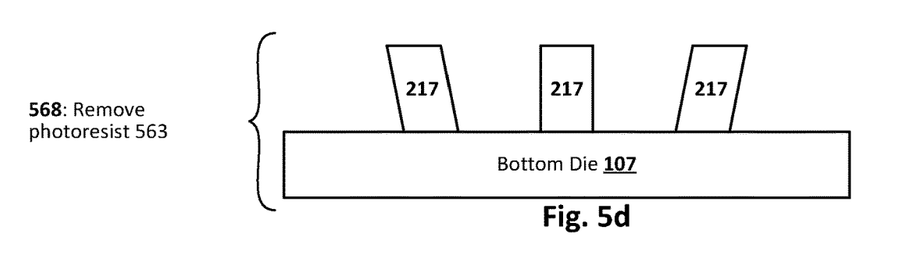

As can be seen in FIG. 5d at 568, the method continues with removing the remaining photoresist 563 to expose the metal pillars 217. Any suitable photoresist stripping processes can be used, as will be appreciated. The angle of the tilted pillars can vary as previously explained, but $A_L$ and $A_R$ angles in the range of about 5 to 60 degrees can be provisioned according to some embodiments. More severe angles (e.g., in the range of 45 to 65 degrees) may be obtained, depending on the configuration of lens 567 and the type of photoresist 563.

FIG. 6a through 6e illustrate a method for forming slanted metal pillars 217 over a bottom die 107, according to another embodiment of the present disclosure. As previously explained, this example methodology includes the use of laser drilling and electroplating, although other metal deposition may be used as well. The method is generally designated at 450b, to show that it is one example methodology that can be used at 450 of FIG. 4 in the forming of metal pillars 217.

Figure 6A:
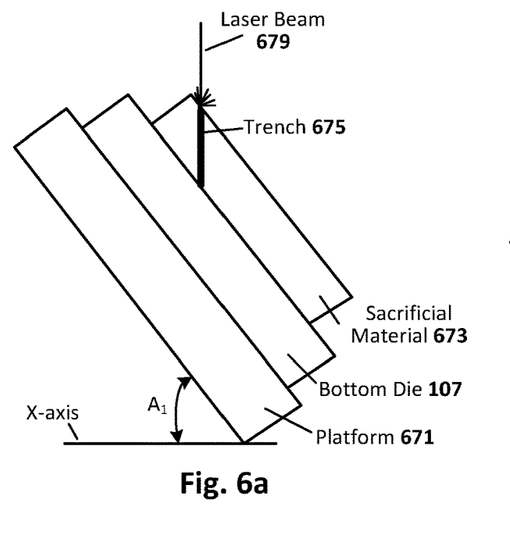
FIG. 6a through 6e illustrate a method for forming slanted metal pillars over a bottom die, according to another embodiment of the present disclosure.

As can be seen in FIG. 6a, a layer of sacrificial material 673 is deposited over the bottom die 107 and the bottom die 107 is mounted on a lasing system platform 671. As will be appreciated, the sacrificial material 673 can be any material that can be laser drilled to provide the trenches 675 which are eventually filled with metal. Example sacrificial materials 673 include, for instance, polymers and oxides. In some embodiments, for instance, material 673 is mold material 103, and can be left in place after laser drilling (and therefore is not really sacrificial, in such case).

Figure 6B:
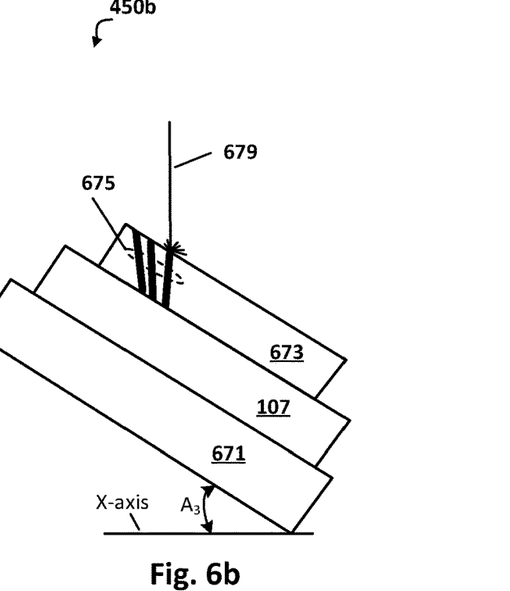
Figure 6C:
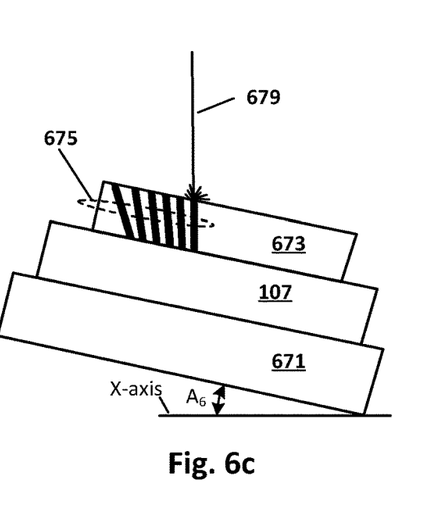
Figure 6D:
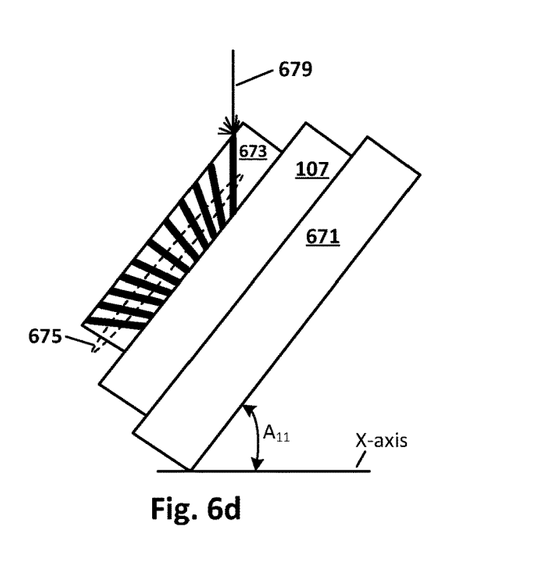

In operation, the platform 671 can be angled to adjust the angle at which the laser beam 679 impinges upon the sacrificial material 673. The platform 671 can be coupled to, for example, a hexapod or other multi-axis positioning system, according to some embodiments, although other multi-axis platforms that allow for multiple angle positioning of a given work piece can be used. One or more trenches 675 can be drilled at a time (multiple laser beams 679 can simultaneously drill multiple trenches 675, or a single laser beam 679 can drill one trench 675 at a time). FIG. 6a shows the trench 675 drilled at angle $A_1$, FIG. 6b shows three trenches 675 including the one drilled at angle $A_3$, FIG. 6c shows six trenches 675 including the one drilled at angle $A_6$, and FIG. 6d shows eleven trenches 675 including the one drilled at angle $A_{11}$. The laser beam 679 can be turned on and off in a timely fashion as the platform places the workpiece in the targeted positions. The laser can be implemented with any suitable laser technology, such as pulsed Nd:YAG and $CO_2$ lasers. The laser power and pulse duration can be set depending on factors such as the material 673 being lasered and the geometry (e.g., depth and width) of the trenches 675.

Figure 6E:
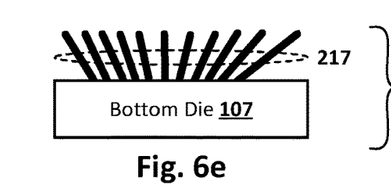

As can be seen in FIG. 6e at 677, the method further includes filling trenches 675 with metal, and removing an excess metal and possibly the sacrificial material 673, and releasing the die 107 from platform 671. In some embodiments, this includes electroplating copper into the trenches 675, although other embodiments may use other metals (e.g., silver, gold, etc) and/or other deposition techniques (e.g., spraying, spin coating, printing). Grinding or CMP can be used to remove any excess metal, and to adjust the height of the metal pillars. The resulting structure includes bottom die 107 having a number of metal pillars 217 thereon. As can be further seen in this example embodiment, at least some of those pillars 217 are slanted. Note the diversity of the slant angles of the different pillars (some tilt angles are more severe than others, and some pillars 217 are not tilted or otherwise substantially vertical. The angle of the tilted pillars can vary as previously explained, but $A_L$ and $A_R$ angles in the range of about 5 to 60 degrees can be provisioned according to some embodiments. More severe angles may be obtained, depending on the configuration of platform 671 and the type of material 673 and type of laser.

FIGS. 7a through 7f collectively illustrate a method for forming an integrated circuit package including a stacked-die configuration and slanted or otherwise laterally-extended metal fillets under the mold material to conduct heat from the bottom die to the integrated heat spreader by way of the top die, according to an embodiment of the present disclosure. As can be seen, the integrated circuit package shown in FIGS. 3a and 3b is used to demonstrate the method, but any integrated circuit package of arbitrary configuration can benefit from the methodology. To this end, the methodology can be broadly applied to fabricate metal fillets or bodies in hot spot regions of any number of integrated circuit packages, as will be appreciated in light of this disclosure.

Figure 7A:
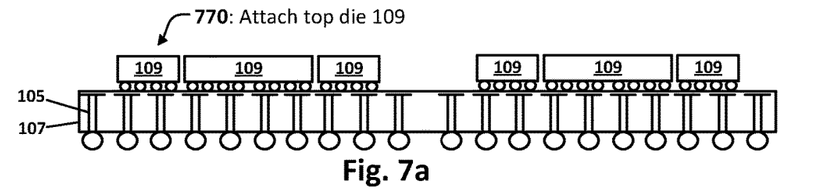
FIGS. 7a through 7f collectively illustrate a method for forming an integrated circuit package including a stacked-die configuration and slanted or otherwise laterally-extended metal fillets under the mold material to conduct heat from the bottom die to the integrated heat spreader by way of the top die, according to an embodiment of the present disclosure.

As can be seen in FIG. 7a at 770, the method includes attaching top die 109 to lower die 107. In this example case, flip-chip technology is used to attach die 109 to die 107, as well as to eventually attach die 107 to package 101, although any suitable mounting technology can be used, as previously explained. In addition, the previous relevant discussions with respect to the configuration inside bottom die 107 and top die 109 as well as the number and layout of those die being arbitrary, as well as how the stacked-die configuration includes potential hot spot regions, are equally applicable here. In the example case shown here, the hot spot regions happen to be in locations where there is no top die 109 over bottom die 107 (or locations where there is no top die 109 over a relatively large portion of bottom die 107), which allows a relatively large volume of molding material to deposit there. As previously explained, mold material is not a particular good thermal conductor.

Figure 7B:
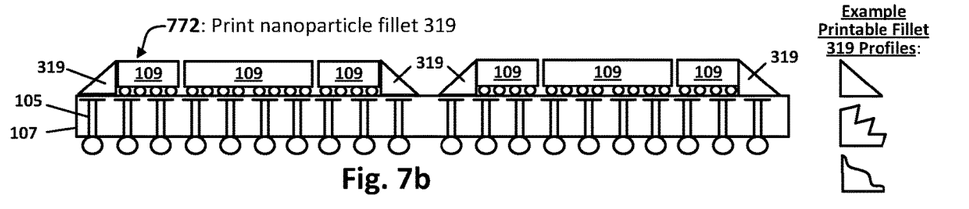

As can be seen in FIG. 7b at 772, the method continues with forming metal nanoparticle bodies or fillets 319 on lower die 107. Note how the metal fillet 319 has its bottom surface on a thermally conductive surface or feature of lower die 107, and one of its sidewalls on a thermally conductive surface or feature of top die 109. This arrangement effectively creates a thermal pathway from the lower die 107 to top die 109 to the IHS 111. In some embodiments, note that the upper edge of the metal fillet 319 may be exposed during the removal process at 776 (to be discussed in turn). In such cases, note that the exposed edge portion of metal fillet 319 may contact bonding material 113 (added later in process, at 780) so as to provide another path for thermal transfer to the IHS 111. Moreover, the slanted sidewall of metal fillet 319 allows heat to dissipate in the lateral direction as well as the vertical direction, in a similar fashion as a tilted pillar 217, thereby improving heat transfer under the mold material 103 (which is later deposited at 774, as will be discussed in turn). The previous relevant discussions with respect to forming processes and configuration of die 107, including the number of copies of individual die making up die 107, are equally applicable here. In a more general sense, the metal fillets 319 can be formed on any feature of die 107 that allows for dissipation of heat from die 107 up through the metal fillets 319, and ultimately to the heat spreader 111.

Example forming processes for metal fillets 319 include inkjet printing metal nanoparticles and 3D printing metal, although other metal deposition processes can be used to form metal features have sidewalls that extend in a rise-and-run fashion (vertical and horizontal, so as to have one or more acute slopes of greater than 0.5 degrees but less than 89.5 degrees, as measured from the horizontal axis, according to some embodiments). The shape of the metal body 319 can vary from one embodiment to the next, as will be appreciated. In some cases, the metal body has a major surface that slopes at an angle in the range of 5 to 60 degrees. As can further be seen with respect to the example profiles depicted in FIG. 7b, the major surface need not be straight, and may instead have a stepped (including jagged) or curvilinear profile, and may be irregular or non-consistent. In any such cases, the surface still effectively has a major rise-and-run aspect that that extends both vertically and laterally from a bottom surface of the mold material 103 to an upper or side surface of the mold material 103. As previously explained, the metal fillets or bodies 319 can be any metal having a desired level of thermal conductivity, such as copper, silver, or gold, to name a few examples. Different K (thermal conductivity) values of the metal nanoparticles can be obtained under different processing temperatures. For example, a K of 344 W/m-K can be achieved at 325° C. sintering of silver nanoparticles. Sintering can be carried out, for example, using laser scanning. The desired K value of the silver (or other metal) nanoparticles can be obtained under different laser scanning temperatures (controlled by laser intensity and laser scanning speed). Numerous printing and sintering schemes will be appreciated.

Figure 7C:
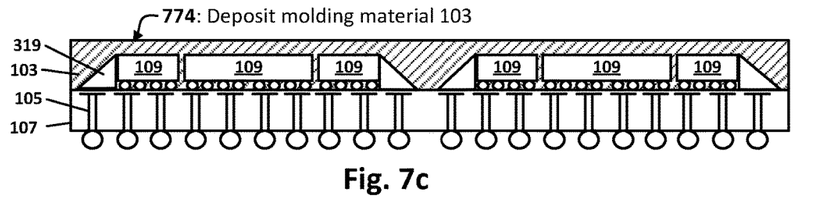
Figure 7D:
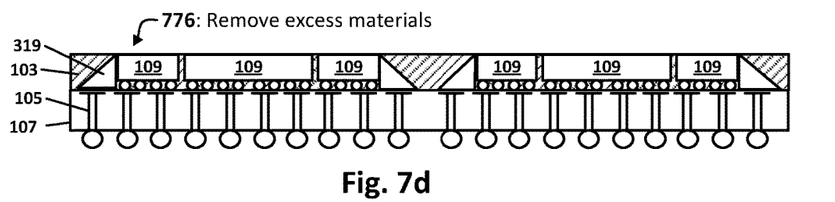

As can be seen in FIGS. 7c and 7d at 774 and 776, respectively, the method continues with depositing mold material 103 over the stacked-die arrangement, and removing any excess materials. The previous relevant discussions with respect to mold materials and material removal techniques are equally applicable here.

Figure 7E:
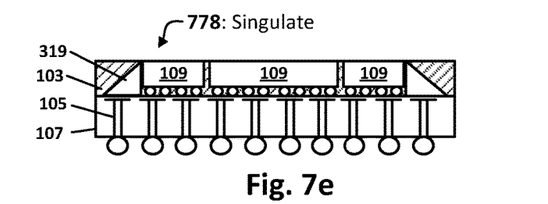
Figure 7F:
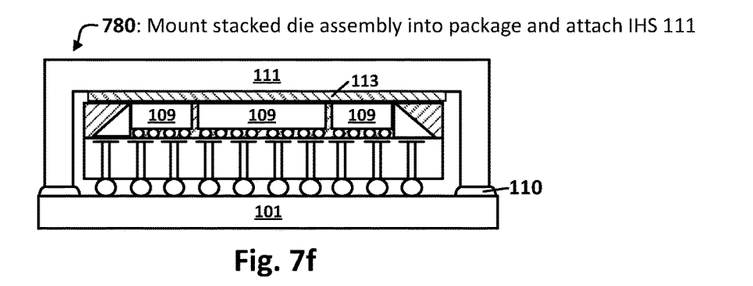

As can be seen in FIGS. 7e and 7f at 778 and 780, respectively, the method continues with singulating the wafer or overall structure so as to release individual stacked-die assemblies, and mounting the stacked-die assembly into package 101, and attaching the integrated heat spreader 111 with use of sealant 110. The previous relevant discussions with respect to singulation processes and tools, as well as package and heat spreader technologies and bonding material 113, are equally applicable here.

Computing System

Figure 8:
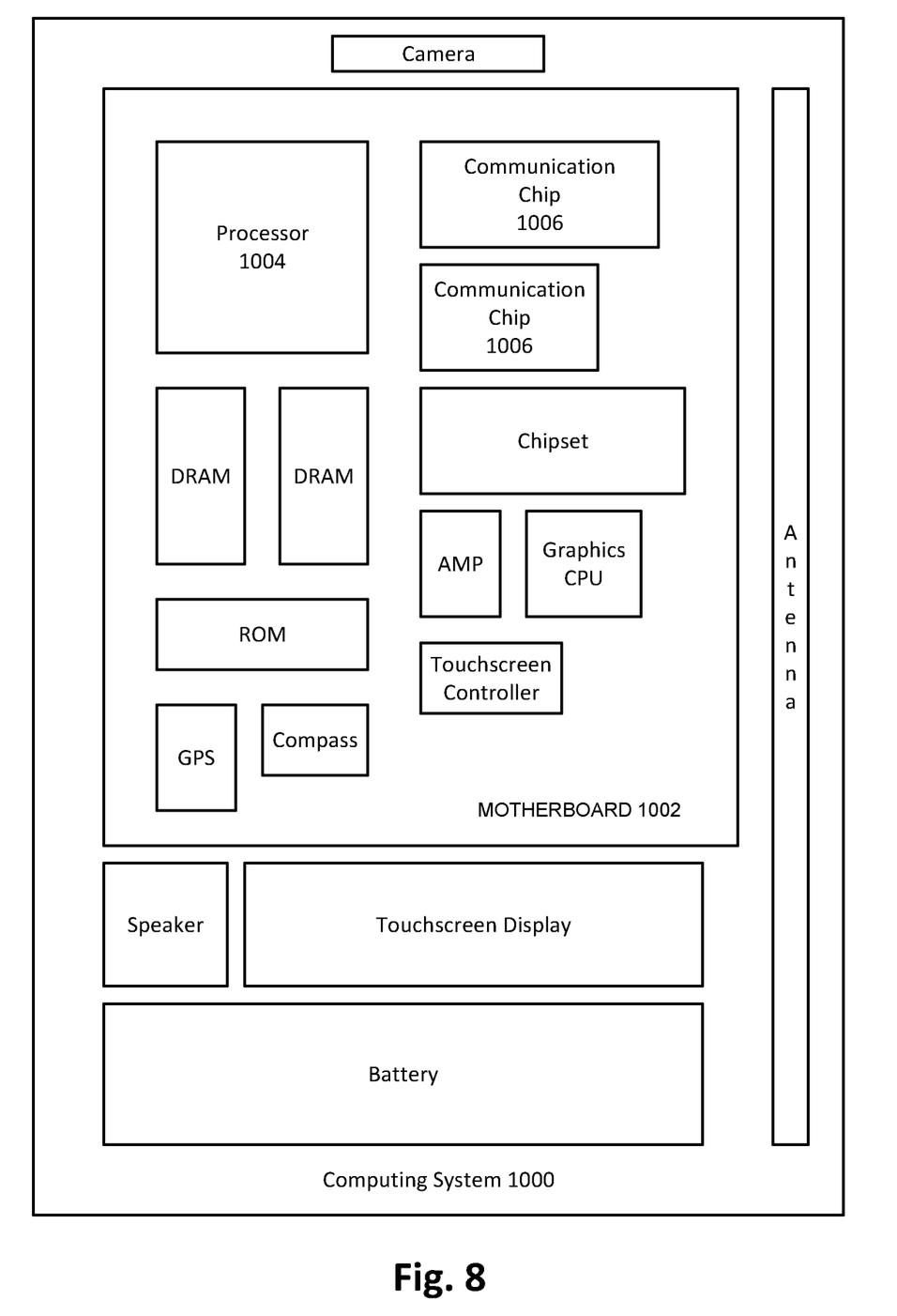
FIG. 8 illustrates a computing system implemented with one or more stacked-die packages configured in accordance with an embodiment of the present disclosure.

FIG. 8 illustrates a computing system implemented with one or more stacked-die packages configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board or card-level assembly, whether a main board or a daughterboard mounted on a main board or the only board of system 1000, or a card installed in the chassis of system 1000. Depending on its applications, computing system 1000 may include one or more other components that may or may not be physically and electrically coupled to the motherboard 1002. In an embodiment, these other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more stacked-die packages having rise-and-run metal features (e.g., tilted pillars and/or slanted fillets within and/or under mold material) that dissipate heat both vertically and laterally, as variously described herein. In some example embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the processor 1004 has a stacked-die package configuration as variously described herein, including angled or sloping or tilted metal features that dissipate heat both vertically and laterally, or otherwise include a rise-and-run aspect. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the communication chip 1006 has a stacked-die package as variously described herein, including metal features that include a rise-and-run aspect so as to dissipate heat both vertically and laterally. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more stacked-die package configurations as variously provided herein. As will be appreciated in light of this disclosure, various embodiments of the present disclosure can be used to improve performance on products fabricated at any process node (e.g., in the micron range, or sub-micron and beyond) by allowing for the use of vertically stacked die having any number of configurations.

Further Example Embodiments

The following examples pertain to further embodiments, from which numerous permutations and configurations will be apparent.

Example 1 includes an integrated circuit package, including: a first die; a second die above the first die; a mold material over the first die and at least partially adjacent to the second die; a metal feature in thermal contact with the first die and having a surface that extends both vertically and laterally from a bottom surface of the mold material to an upper or side surface of the mold material; and a heat spreader in thermal contact with the metal feature.

Example 2 includes the subject matter of Example 1, wherein the metal feature is a slanted metal pillar that runs through at least a portion of the mold material.

Example 3 includes the subject matter of Example 2, wherein the slanted metal pillar slants from the vertical axis at an angle in the range of 5 to 60 degrees.

Example 4 includes the subject matter of Example 2 or 3, wherein the slanted metal pillar slants from the vertical axis at an angle in the range of 15 to 40 degrees.

Example 5 includes the subject matter of any of Examples 2 through 4, wherein the slanted metal pillar is one of a plurality of metal pillars in the mold material.

Example 6 includes the subject matter of any of Examples 2 through 5, wherein the slanted metal pillar thermally connects the first die to the heat spreader.

Example 7 includes the subject matter of any of Examples 2 through 6, wherein the slanted metal pillar thermally connects the first die to the second die.

Example 8 includes the subject matter of Example 1, wherein the metal feature is a metal body on the first die and that extends under at least a portion of the mold material.

Example 9 includes the subject matter of Example 8, wherein the metal body has a major surface that slopes at an angle in the range of 5 to 60 degrees.

Example 10 includes the subject matter of Example 9, wherein the major surface is nonlinear. For instance, the surface could be curvilinear or jagged or saw-toothed or otherwise rise and fall in an irregular or regular pattern.

Example 11 includes the subject matter of any of Examples 8 through 10, wherein the metal body thermally connects the first die to one or both of the heat spreader and the second die.

Example 12 includes the subject matter of any of the preceding Examples, wherein the heat spreader is integrated with a package to provide an enclosed area, and the first die, second die, mold material, and metal feature are within the enclosed area.

Example 13 includes the subject matter of any of the preceding Examples, wherein the metal feature is copper or silver.

Example 14 is an integrated circuit package, including: a package integrated with a heat spreader thereby defining an internal volume; a first die within the internal volume; a second die within the internal volume and above the first die; a mold material within the internal volume and over the first die and at least partially adjacent to the second die; a metal feature in thermal contact with the first die and having a surface that extends both vertically and laterally from a bottom surface of the mold material to an upper or side surface of the mold material; and a bonding material thermally connecting the heat spreader to the second die. Recall that the second die is not necessarily directly above the first die; rather, the second die is higher than the first die may or may not be directly above the first die.

Example 15 includes the subject matter of Example 14, wherein the metal feature is a slanted metal pillar that runs through at least a portion of the mold material.

Example 16 includes the subject matter of Example 15, wherein the slanted metal pillar slants from the vertical axis at an angle in the range of 5 to 60 degrees.

Example 17 includes the subject matter of Example 15 or 16, wherein the slanted metal pillar slants from the vertical axis at an angle in the range of 15 to 40 degrees.

Example 18 includes the subject matter of any of Examples 15 through 17, wherein the slanted metal pillar is one of a plurality of metal pillars in the mold material.

Example 19 includes the subject matter of any of Examples 15 through 18, wherein the slanted metal pillar thermally connects the first die to the heat spreader.

Example 20 includes the subject matter of any of Examples 15 through 19, wherein the slanted metal pillar thermally connects the first die to the second die.

Example 21 includes the subject matter of Example 14, wherein the metal feature is a metal body on the first die and that extends under at least a portion of the mold material.

Example 22 includes the subject matter of Example 21, wherein the metal body has a major surface that slopes at an angle in the range of 5 to 60 degrees.

Example 23 includes the subject matter of Example 22, wherein the major surface is stepped or curvilinear. Note that the stepped or curvilinear aspect may be regular or irregular in its nature. Thus, the major surface need not be patterned in a symmetrical, repeating, or otherwise consistent manner.

Example 24 includes the subject matter of any of Examples 21 through 23, wherein the metal body thermally connects the first die to one or both of the heat spreader and the second die.

Example 25 includes the subject matter of any of Examples 14 through 24, wherein the metal feature is copper or silver.

Example 26 is a card including the integrated circuit package of any of the preceding Examples. The card may be, for instance, a graphics processing card or a mother board or a printed circuit board.

Example 27 is a chassis including the integrated circuit package of any of Examples 1 through 25, or the card of Example 26. The chassis can be part of an overall bigger system and may include multiple cards and/or other components and features, as will be appreciated.

Example 28 is an electronic system including the integrated circuit package of any of Examples 1 through 25, or the card of Example 26, or the chassis of Example 27. The system can be, for instance, a computing system, a server computer system, a mobile computing system such as a laptop or smartphone, or a game console, to name a few examples.

Example 29 is a method forming an integrated circuit package. The method includes: forming a metal feature in thermal contact with a first die; depositing a mold material over the first die and at least partially adjacent to a second die, the second die being above the first die in a stacked-die configuration; and providing a heat spreader in thermal contact with the metal feature; wherein the metal feature has a surface that extends both vertically and laterally from a bottom surface of the mold material to an upper or side surface of the mold material.

Example 30 includes the subject matter of Example 29, wherein the metal feature is a slanted metal pillar that runs through at least a portion of the mold material.

Example 31 includes the subject matter of Example 30, wherein the slanted metal pillar is one of a plurality of metal pillars in the mold material.

Example 32 includes the subject matter of Example 30 or 31, wherein the slanted metal pillar thermally connects the first die to the heat spreader.

Example 33 includes the subject matter of any of Examples 30 through 32, wherein the slanted metal pillar thermally connects the first die to the second die.

Example 34 includes the subject matter of Example 29, wherein the metal feature is a metal body on the first die and that extends under at least a portion of the mold material, and forming the metal feature includes inkjet printing the metal body.

Example 35 includes the subject matter of Example 34, wherein forming the metal feature further includes sintering the inkjet printed metal body.

Example 36 includes the subject matter of Example 34 or 35, wherein the metal body has a major surface that slopes at an angle in the range of 5 to 60 degrees.

Example 37 includes the subject matter of Example 36, wherein the major surface is nonlinear and slopes at an average angle in the range of 5 to 60 degrees.

Example 38 includes the subject matter of any of Examples 34 through 37, wherein the metal body thermally connects the first die to one or both of the heat spreader and the second die.

Example 39 includes the subject matter of any of Examples 29 through 38, the method further including: integrating the heat spreader with a package to provide an enclosed area, wherein the first die, second die, mold material, and metal feature are within the enclosed area.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit package, comprising:
   a first die;
   a second die above the first die;
   a mold material over the first die and at least partially adjacent to the second die;
   a metal feature in thermal contact with the first die and having a surface that extends both vertically and laterally from a bottom surface of the mold material to an upper or side surface of the mold material; and
   a heat spreader in thermal contact with the metal feature.

2. The integrated circuit package of claim 1, wherein the metal feature is a slanted metal pillar that runs through at least a portion of the mold material.

3. The integrated circuit package of claim 2, wherein the slanted metal pillar slants from the vertical axis at an angle in the range of 5 to 60 degrees.

4. The integrated circuit package of claim 2, wherein the slanted metal pillar is one of a plurality of metal pillars in the mold material.

5. The integrated circuit package of claim 2, wherein the slanted metal pillar thermally connects the first die to the heat spreader.

6. The integrated circuit package of claim 1, wherein the metal feature is a metal body on the first die and that extends under at least a portion of the mold material.

7. The integrated circuit package of claim 6, wherein the metal body has a major surface that slopes at an angle in the range of 5 to 60 degrees.

8. The integrated circuit package of claim 7, wherein the major surface is nonlinear.

9. The integrated circuit package of claim 6, wherein the metal body thermally connects the first die to one or both of the heat spreader and the second die.

10. The integrated circuit package of claim 1, wherein the heat spreader is integrated with a package to provide an enclosed area, and the first die, second die, mold material, and metal feature are within the enclosed area.

11. The integrated circuit package of claim 1, wherein the metal feature is copper or silver.

\* \* \* \* \*